(12) United States Patent
Chang

(10) Patent No.: US 9,337,672 B2
(45) Date of Patent: May 10, 2016

(54) DISPLAYING APPARATUS AND MOBILE ELECTRONIC DEVICE AND DISPLAYING FRAME THEREOF

(71) Applicants: Inventec Appliances (Pudong) Corporation, Shanghai (CN); INVENTEC APPLIANCES CORP., New Taipei (TW); INVENTEC APPLIANCES (SHANGHAI) CO., LTD, Shanghai (CN)

(72) Inventor: Chia-Yao Chang, New Taipei (TW)

(73) Assignees: Inventec Appliances (Pudong) Corporation, Shanghai (CN); Inventec Appliances Corp., New Taipei (TW); Inventec Appliances (Shanghai) Co., Ltd., Shanghai (CN)

( * ) Notice: Subject to any disclaimer, the term of this patent is extended or adjusted under 35 U.S.C. 154(b) by 245 days.

(21) Appl. No.: 14/046,090

(22) Filed: Oct. 4, 2013

(65) Prior Publication Data

US 2014/0098511 A1 Apr. 10, 2014

(30) Foreign Application Priority Data

Oct. 8, 2012 (CN) .......................... 2012 1 0378736

(51) Int. Cl.
*H02J 7/00* (2006.01)
*H05K 7/02* (2006.01)
*G06F 1/16* (2006.01)

(52) U.S. Cl.
CPC ............. *H02J 7/0031* (2013.01); *G06F 1/1632* (2013.01); *H05K 7/02* (2013.01)

(58) Field of Classification Search
CPC ......... H02J 7/0003–7/0068; H05K 7/02–7/14; H05K 7/1061; H05K 7/1084; G06F 1/1632

USPC .......... 307/71–85, 150; 320/2, 107, 113–115, 320/133; 323/229, 285; 327/320; 361/625, 361/679.41–679.44; 363/37, 74, 81; 420/96–100; 248/346

See application file for complete search history.

(56) References Cited

U.S. PATENT DOCUMENTS

| | | | | |
|---|---|---|---|---|
| 4,322,833 A | * | 3/1982 | Husted | ............................ 368/69 |
| 4,902,956 A | * | 2/1990 | Sloan | ............................ 320/135 |
| 5,479,486 A | * | 12/1995 | Saji | ................................ 455/573 |
| 5,602,458 A | * | 2/1997 | Dowe | ............................ 396/205 |
| 5,642,517 A | * | 6/1997 | Shirota | ................. G06F 1/1632 307/23 |
| 5,686,810 A | * | 11/1997 | Yasui | .................... H01M 10/46 320/107 |
| 5,793,123 A | * | 8/1998 | Ho et al. | .......................... 307/66 |
| 5,894,415 A | * | 4/1999 | Habegger | ........................ 363/65 |

(Continued)

*Primary Examiner* — Zachary M Pape
*Assistant Examiner* — Amir Jalali
(74) *Attorney, Agent, or Firm* — Muncy, Geissler, Olds & Lowe, P.C.

(57) ABSTRACT

Disclosed are a displaying apparatus, a mobile electronic device, and a displaying frame. The displaying apparatus includes a mobile electronic device and a displaying frame. The mobile electronic device includes an electrical power contact, a circuit-breaking contact, and a battery circuit. The electrical power contact is electrically connected to the battery circuit, and the circuit-breaking contact is positioned corresponding to a control point of the battery circuit. The displaying frame includes a conductive part and an insulation part. When the mobile electronic device is disposed in the displaying frame, the conductive part is configured to press against the electrical power contact for transmitting electric power to the mobile electronic device, and the insulation part is configured to be inserted into the circuit-breaking contact to push the control point for breaking the battery circuit.

12 Claims, 6 Drawing Sheets

(56) References Cited

U.S. PATENT DOCUMENTS

| | | | |
|---|---|---|---|
| 5,933,812 A * | 8/1999 | Meyer et al. | 705/15 |
| 6,400,969 B1 * | 6/2002 | Yamashita et al. | 455/573 |
| 6,538,345 B1 * | 3/2003 | Maller | H02J 9/061 307/64 |
| 7,112,096 B2 * | 9/2006 | Moisevenko | G06F 1/1635 439/638 |
| 7,688,075 B2 * | 3/2010 | Kelley et al. | 324/426 |
| 8,442,455 B2 * | 5/2013 | Choi | 455/90.3 |
| 8,659,270 B2 * | 2/2014 | Hermann et al. | 320/164 |
| 2006/0091853 A1 * | 5/2006 | Briggs et al. | 320/114 |
| 2006/0258409 A1 * | 11/2006 | Kogan | 455/573 |
| 2010/0250815 A1 * | 9/2010 | Street et al. | 710/303 |
| 2011/0133696 A1 * | 6/2011 | Scrimshaw | B25F 5/00 320/115 |
| 2013/0201641 A1 * | 8/2013 | Soden et al. | 361/752 |
| 2013/0335914 A1 * | 12/2013 | Lee | G02F 1/1632 361/679.41 |
| 2014/0191033 A1 * | 7/2014 | Wojcik et al. | 235/449 |
| 2014/0191724 A1 * | 7/2014 | Wojcik et al. | 320/114 |
| 2014/0333366 A1 * | 11/2014 | Deam | 327/389 |
| 2015/0137770 A1 * | 5/2015 | Bencuya | H02J 7/0045 320/162 |

* cited by examiner

DISPLAYING APPARATUS AND MOBILE ELECTRONIC DEVICE AND DISPLAYING FRAME THEREOF

CROSS-REFERENCE TO RELATED APPLICATION

This application claims the benefit of China Patent Application No. 201210378736.3, filed on Oct. 8, 2012, in the State intellectual Property Office of the People's Republic of China, the disclosure of which is incorporated herein in its entirety by reference.

BACKGROUND OF THE INVENTION

1. Field of the Invention

The present invention relates to a displaying apparatus and its mobile electronic device and displaying frame, and more particularly to the displaying apparatus and its mobile electronic device and displaying frame capable of providing only the required electric power or providing the required electric power and charging a battery for a period of time while in use.

2. Description of the Related Art

As science and technology advance, the design of electronic products becomes increasingly more innovative and the functions of electronic products become increasingly more diversified. As large as smart refrigerators, televisions and personal computers and as small as tablet PCs, electronic book readers and smart phones, all mobile electronic devices generally come with a multifunctional computing capability, not only capable of maintaining the required applications of the products, but also capable of providing add-on functions such as the access to the Internet resources or the playing of multimedia videos.

At present, major manufacturers or the general public use a mobile electronic device as a digital photo frame for displaying photos or as a display platform for displaying the contents of digital videos or advertisements. For example, the tablet PC is generally put into a frame that is provided for placing the tablet PC during the display time as well as supplying power to the tablet PC. However, if the tablet PC is used for a long time of display, the frame will keep charging a battery of the tablet PC, so that the battery of the tablet PC may be expanded, overheated, burned or even explode easily due to the excessive charge of the battery. There is an unpredictable risk in the use of the tablet PC.

Although most mobile electronic devices come with a protective design in the charging circuit, some mobile electronic devices just change their way of charging by using a low current, and some mobile electronic devices adopt voltage detection to charge the battery periodically. These aforementioned arrangements usually have negative effects on the battery, and there are still risks in using such electronic devices.

SUMMARY OF THE INVENTION

In view of the aforementioned problems of the prior art, an objective of the present invention is to provide a displaying apparatus, a mobile electronic device, and a displaying frame to overcome the problems with a common mobile electronic device (such as a tablet PC) which is placed in a charging frame while the charging frame is charging the mobile electronic device, which position of the mobile electronic device may cause damage to (the battery of) the mobile electronic device easily.

Therefore, the present invention provides a displaying apparatus comprising a mobile electronic device and a displaying frame. The mobile electronic device includes an electrical power contact, a circuit-breaking contact, and a battery circuit having a control point (for example, a control switch). The electrical power contact is electrically connected to the battery circuit, and the circuit-breaking contact is positioned corresponding to the control point of the battery circuit. The displaying frame includes a conductive part and an insulation part. When the mobile electronic device is disposed or placed in the displaying frame, the conductive part is configured to press against the electrical power contact to transmit electric power to the mobile electronic device, and the insulation part is configured to be inserted into the circuit-breaking contact to push the control point for breaking the battery circuit.

Preferably, the conductive part and the insulation part jut out from a surface of the displaying frame when the mobile electronic device is not disposed in the displaying frame. Preferably, the conductive part of the displaying frame is elastic, and a height of the conductive part that juts out from a surface of the displaying frame is larger than a height of the insulation part that juts out from the surface of the displaying frame.

In one embodiment, when the mobile electronic device is disposed into the displaying frame, the conductive part presses against the electrical power contact to transmit electric power to the mobile electronic device, before the insulation part pushes the control point for breaking the battery circuit. In another embodiment, when the mobile electronic device is removed from the displaying frame, the insulation part gets away from the control point to close the battery circuit, before the conductive part gets away from the electrical power contact.

Preferably, when the mobile electronic device is not disposed in the displaying frame, the conductive part juts out from a surface of the displaying frame, and the insulation part is elastic and at least partially hidden inside of the displaying frame. In one embodiment, the displaying frame further includes a time-measuring unit and a control unit electrically connected to the time-measuring unit. When the mobile electronic device is disposed in the displaying frame, the time-measuring unit is configured to measure time for a predetermined period of time after which the control unit causes the insulation part to extend so as to push the control point for breaking the battery circuit.

Preferably, the displaying frame further includes a power supply to transmit the electric power to the mobile electronic device through the conductive part.

The present invention also provides a mobile electronic device including an electrical power contact, a circuit-breaking contact, and a battery circuit having a control point (for example, a control switch). The electrical power contact is electrically connected to the battery circuit, and the circuit-breaking contact is positioned corresponding to the control point of the battery circuit. When the mobile electronic device is disposed in a displaying frame including a conductive part and an insulation part, the electrical power contact is configured to press against the conductive part for transmitting electric power to the mobile electronic device, and the control point is to be pushed by the insulation part inserted into the circuit-breaking contact, for breaking the battery circuit.

The present invention further provides a displaying frame for use with a mobile electronic device including an electrical power contact, a circuit-breaking contact, and a battery circuit having a control point. The displaying frame includes a conductive part and an insulation part. When the mobile electronic device, is disposed in the displaying frame, the conductive part is configured to press against the electrical power contact to transmit electric power to the mobile electronic device, and the insulation part is configured to be inserted into the circuit-breaking contact to push the control point for breaking the battery circuit.

Preferably, the conductive part is elastic, and a height of the conductive part that juts out from a surface of the displaying frame is larger than a height of the insulation part that juts out from the surface of the displaying frame.

Preferably, the insulation part is elastic and at least partially hidden inside of the displaying frame. In one embodiment, the displaying frame further includes a time-measuring unit and a control unit electrically connected to the time-measuring unit. When the mobile electronic device is disposed in the displaying frame, the time-measuring unit is configured to measure time for a predetermined period of time after which the control unit causes the insulation part to extend so as to push the control point for breaking the battery circuit.

DETAILED DESCRIPTION OF THE PREFERRED EMBODIMENTS

The technical characteristics, contents, advantages and effects of the present invention will be apparent with the detailed description of a preferred embodiment accompanied with related drawings as follows. It is noteworthy that same numerals are used to represent respective same elements in the following preferred embodiments.

Figure 1:
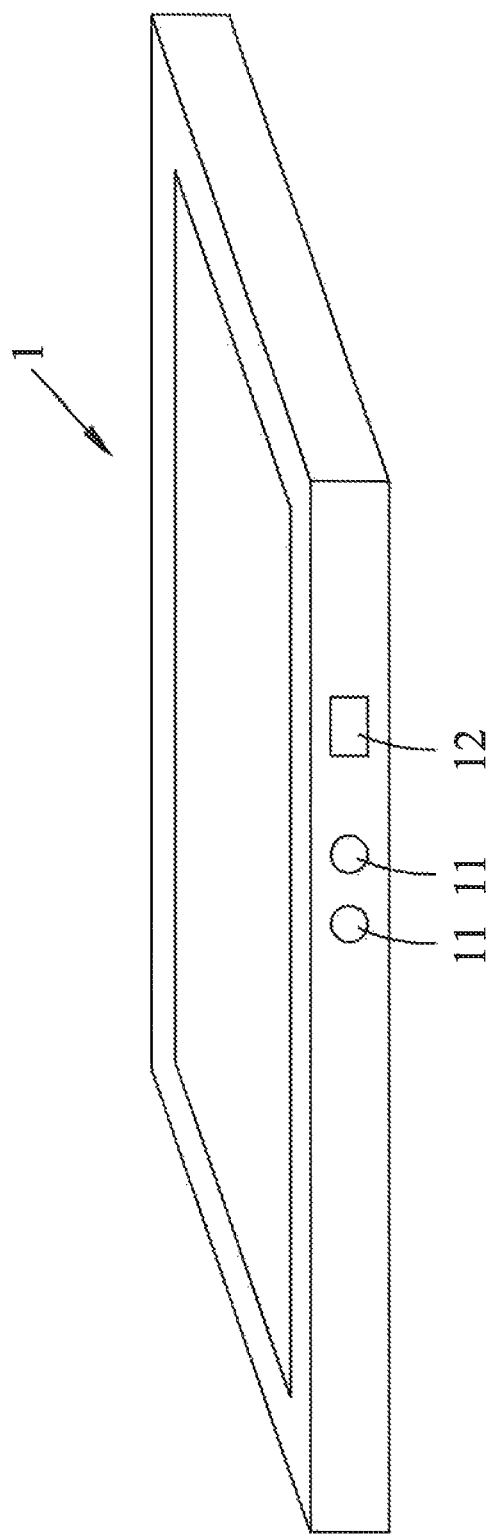
FIG. 1 is a schematic view of a mobile electronic device according to first preferred embodiment of the present invention.
Figure 2:
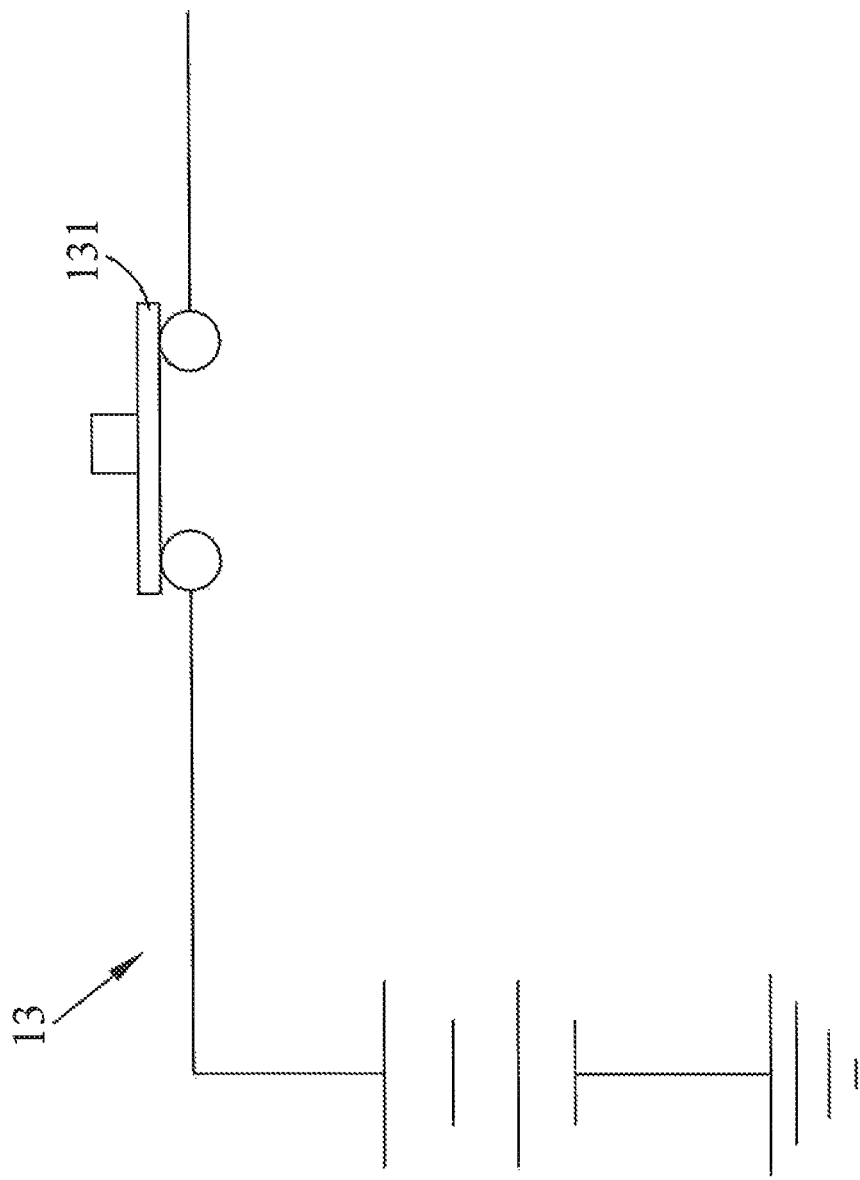
FIG. 2 is a schematic view of a battery circuit of a mobile electronic device according to the first preferred embodiment of the present invention.

With reference to FIG. 1 for a schematic view of a mobile electronic device according to the first preferred embodiment of the present invention, the mobile electronic device 1 can be a Smartphone, a tablet PC, or a PDA. In addition to the design of maintaining the original functions of the mobile electronic device 1, the mobile electronic device 1 further includes an electrical power contact 11 and a circuit-breaking contact 12. The electrical power contact 11 and circuit-breaking contact 12 may be disposed on the mobile electronic device 1. Each of such contacts mentioned herein may be e.g. a special part made for a junction of two electrical conductors through which a current can pass. There are two contact points on the electrical power contacts 11. One is a positive input terminal and the other is a negative input terminal in this preferred embodiment. These contact points on the electrical power contacts 11 are provided for receiving electric power. The circuit-breaking contact 12 includes a slot, but the invention is not limited to such arrangement only. In addition, the mobile electronic device 1 further includes a battery circuit 13. With reference to FIG. 2 for a schematic view of a battery circuit 13 in the mobile electronic device 1 according to the first preferred embodiment of the present invention, the battery circuit 13 is briefly drawn for the purpose of illustrating the present invention, but not intended to limit the scope of the invention. The battery circuit 13 includes a control point 131 or a control switch, and the circuit-breaking contact 12 is positioned corresponding to the control point 131 of the battery circuit 13.

Figure 3:
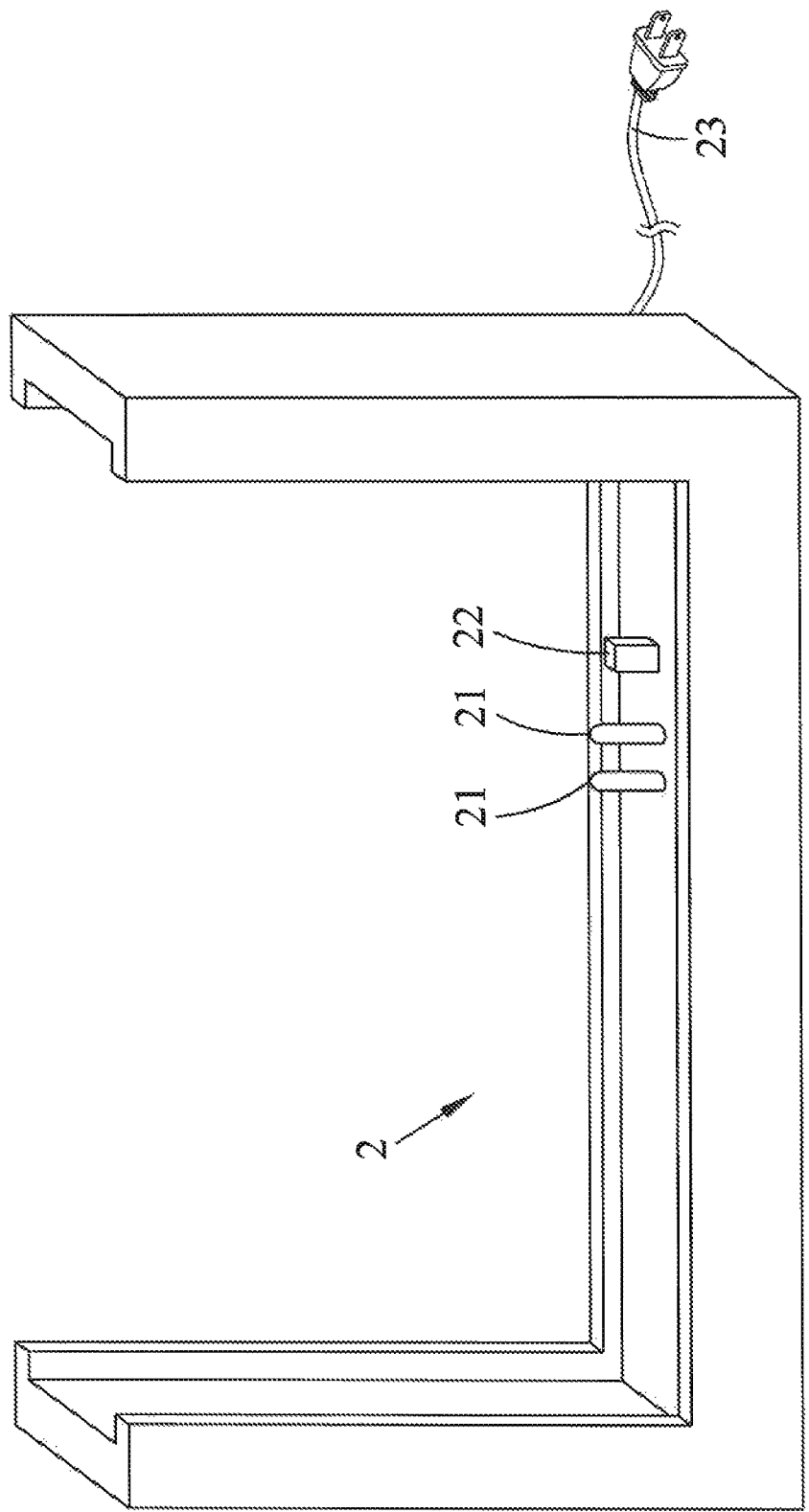
FIG. 3 is a schematic view of a displaying frame according to the first preferred embodiment of the present invention.
Figure 4:
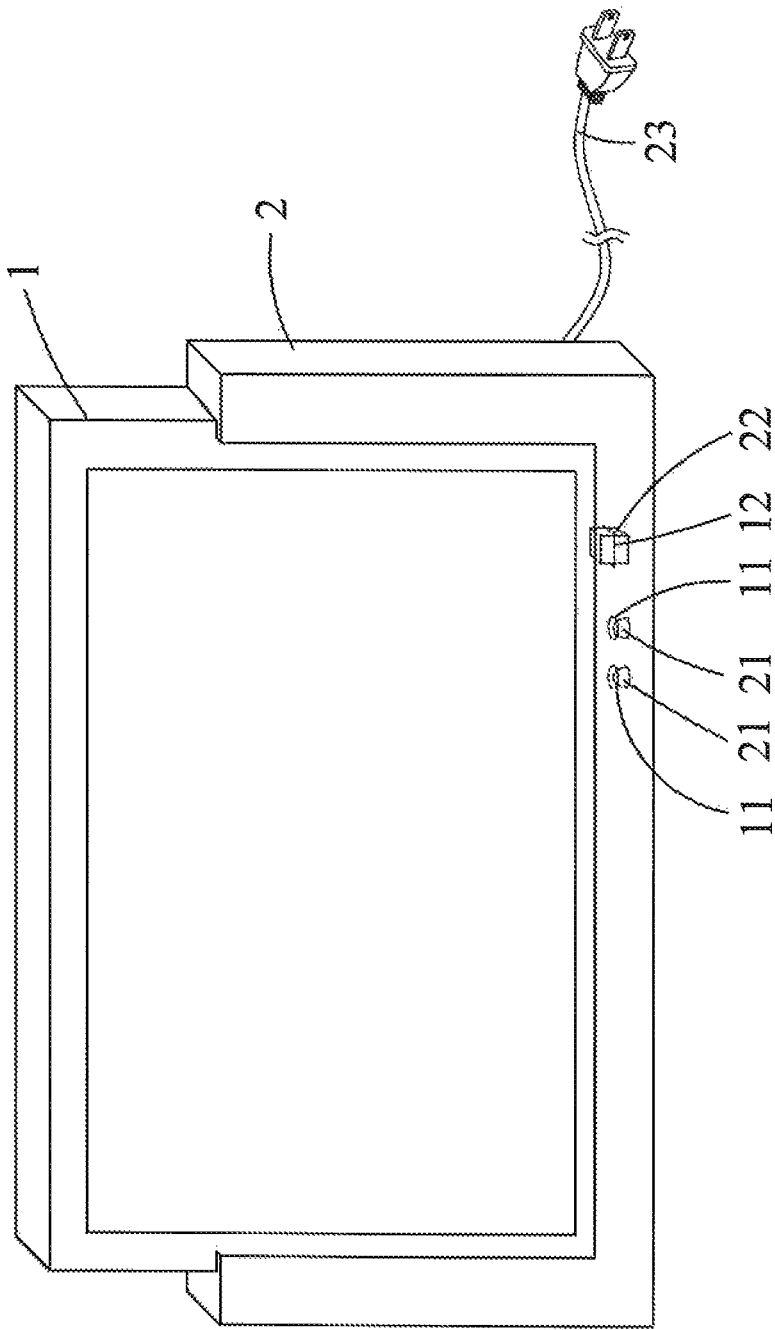
FIG. 4 is a schematic view of a displaying apparatus according to the first preferred embodiment of the present invention.

With reference to FIG. 3 for a schematic view of a displaying frame according to the first preferred embodiment of the present invention, the displaying frame 2 is not limited to the shape or the design as shown in the figure only. The displaying frame 2 includes a conductive part 21 and an insulation part 22. The conductive part 21 and insulation part 22 may be disposed on the displaying frame 2. The quantity and size of the conductive part 21 correspond to the contact points on the electrical power contacts 11 of the mobile electronic device 1. The quantity and size of the insulation parts 22 corresponds to the circuit-breaking contact 12 of the mobile electronic device 1. The conductive part 21 is configured to press against the electrical power contact 11 to transmit power to the mobile electronic device 1, and the insulation part 22 is configured to be inserted into the circuit-breaking contact 12 to push the control point 131 for breaking the battery circuit 13. The conductive part 21 and the insulation part 22 jut out from a surface of the displaying frame 2 when the mobile electronic device 1 is not disposed in the displaying frame 2. A height of the conductive part 21 that juts out from a surface of the displaying frame 2 is larger than a height of the insulation part 22 that juts out from the surface of the displaying frame 2. Preferably, the conductive part 21 has a height equal to 0.5 mm, and the insulation part 22 has a height equal to 0.3 mm. The conductive part 21 is elastic, extensible and contractible, such that when an external force is exerted, the conductive part 21 is compressed with a compression length exactly equal to its height (0.5 mm). However, the present invention is not limited to such arrangement only, and it can be changed according to actual design requirements. In addition, the displaying frame 2 further includes a power supply unit 23 which can be a power plug connected to a mains power socket for transmitting electric power. Alternatively, the power supply unit 23 can be a battery for supplying and transmitting electric power directly.

With reference to FIGS. 1 to 4, FIG. 4 shows a schematic view of a displaying apparatus of the first preferred embodiment of the present invention, wherein the mobile electronic device 1 as shown in FIG. 1 is combined with displaying frame 2 as shown in FIG. 3. The displaying frame 2 is used for placing the mobile electronic device 1 and transmitting the electric power to the mobile electronic device 1, and the combination of the two can be used for displaying information such as the contents of a multimedia video or for other purposes. When the mobile electronic device 1 is placed in the displaying frame 2 to form the displaying apparatus, the conductive part 21 of the displaying frame 2 presses against the electrical power contact 11 of the mobile electronic device 1, and the insulation part 22 is inserted into the circuit-breaking contact 12 of the mobile electronic device 1 for transmitting the electric power from the power supply unit 23 of the displaying frame 2 to the conductive part 21, and then from the conductive part 21 to the mobile electronic device 1 through the electrical power contact 11. By inserting the insulation part 22 into the circuit-breaking contact 12, the battery circuit 13 is disconnected. Besides providing electric power to the mobile electronic device 1, the displaying frame 2 also can break the battery circuit 13 to stop charging the battery in the mobile electronic device 1 to effectively protect the battery from being damaged by a long time of charging.

Figure 5:
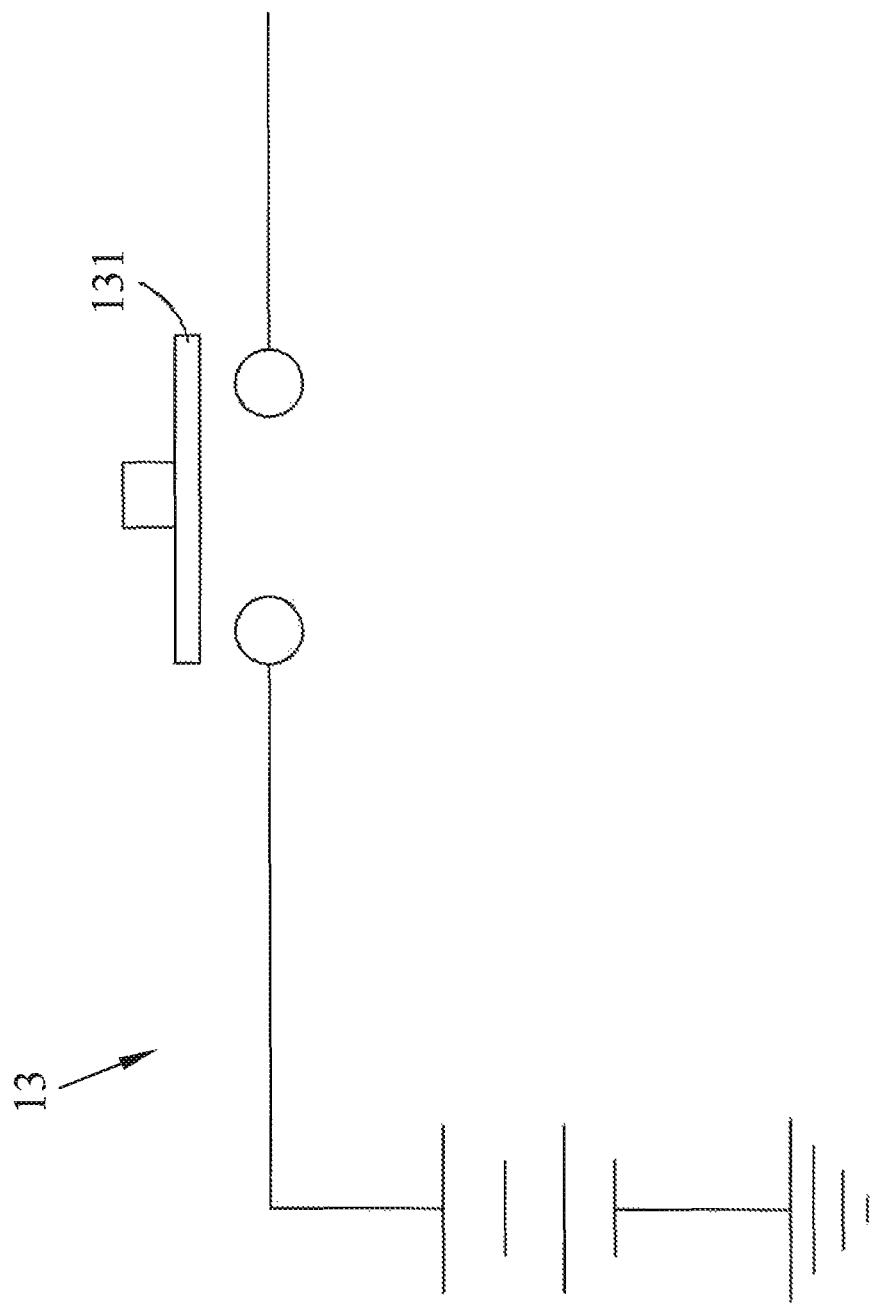
FIG. 5 is a schematic view of a disconnected battery circuit of a mobile electronic device according to the first preferred embodiment of the present invention.
Figure 6:
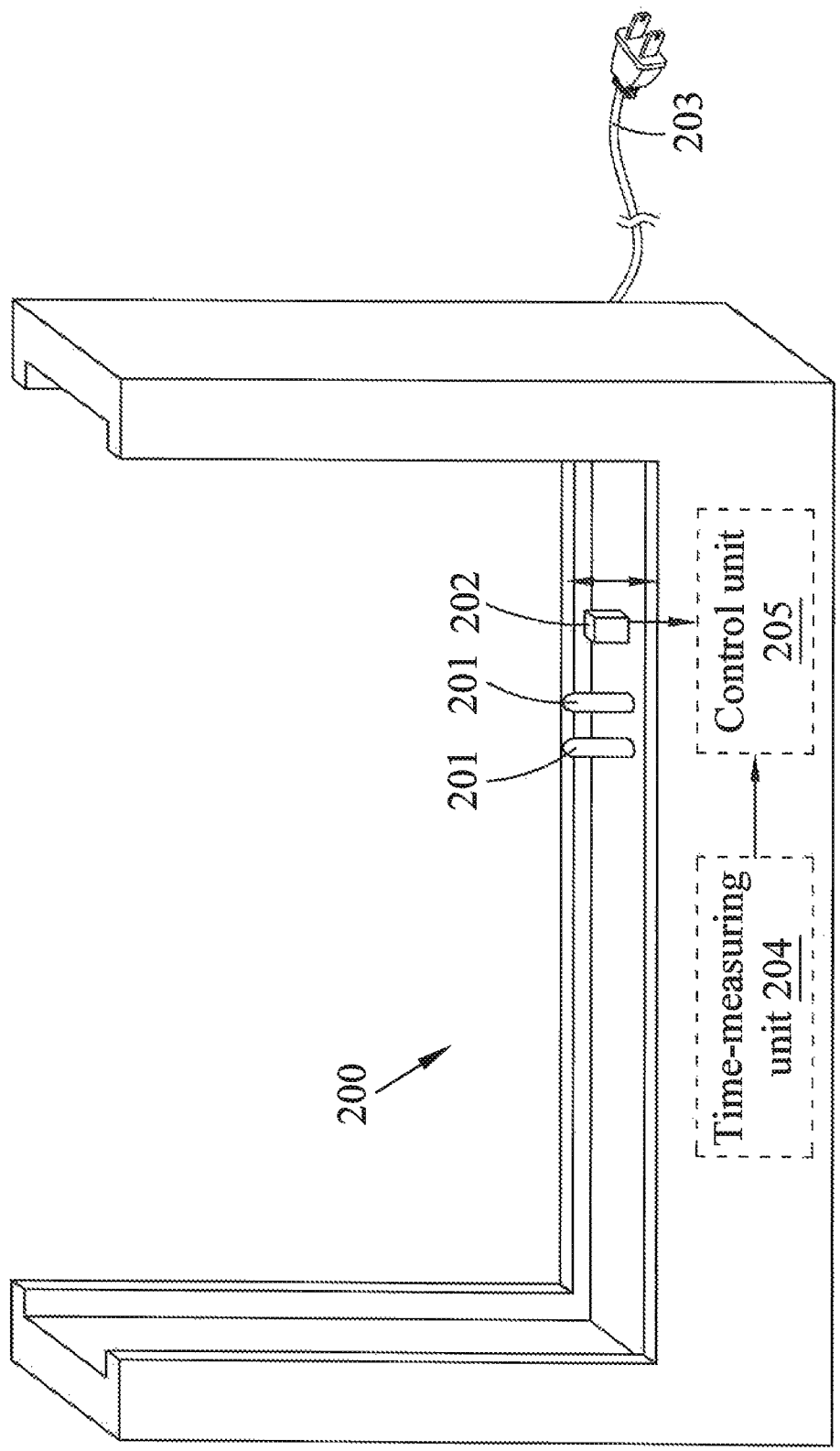
FIG. 6 is a schematic view of a displaying frame according to a second preferred embodiment of the present invention.

More specifically, when the mobile electronic device 1 is disposed in the displaying frame 2 and the insulation part 22 is inserted into the circuit-breaking contact 12, the position of the circuit-breaking contact 12 corresponds to the control point 131 of the battery circuit 13. Thus the insulation part 22 can push away the control point 131 to break the battery circuit 13 as shown in FIG. 5 which is a schematic view of a disconnected battery circuit 13 in a mobile electronic device 1 of the first preferred embodiment of the present invention.

The conductive part 21 of the displaying frame 2 has a height greater than the height of the insulation part 22 (wherein the difference of heights between the two in the first preferred embodiment is 0.2 mm). When the mobile electronic device 1 is disposed in the displaying frame 2 with the compression length of the conductive part 21 being 0.5 mm (which is the height of the conductive part 21), the conductive part 21 presses against the electrical power contact 11 of the mobile electronic device 1 to transmit electric power to the mobile electronic device 1, before the insulation part 22 with the height of 0.3 mm pushes away the control point 131 of the battery circuit 13 to break the battery circuit 13. Such arrangement can prevent the displaying frame 2 from breaking the battery circuit 13 before the electric power is provided to the mobile electronic device 1, and can prevent the mobile electronic device 1 from losing the power needed, which may lead to shut down or to reboot the mobile electronic device 1. On the other hand, when the mobile electronic device 1 is removed from the displaying frame 2, the insulation part 22 gets away from the control point 131 first to resume the control point 131 to its original position, and the battery circuit 13 resumes its electric connection, before the conductive part 21 gets away from the electrical power contact 11. The main purpose of such arrangement is to let the battery circuit 13 be restored and supply the electric power to the mobile electronic device 1 by the charging battery before stopping the supply of electric power to the mobile electronic device 1 through the displaying frame 2. As a result, the mobile electronic device 1 can be removed from the displaying frame 2 without disconnecting the electric power from the mobile electronic device 1, and the mobile electronic device 1 can maintain its original functions and operations normally without being affected by the switching of the power supply.

With reference to FIGS. 1 to 6, FIG. 6 shows a schematic view of a displaying frame according to the second preferred embodiment of the present invention. In the second preferred embodiment, the displaying frame 200 includes a conductive part 201 and an insulation part 202, and the displaying frame 200 further includes a power supply unit 203, which is similar to the displaying frame 2 of the first preferred embodiment as described above. The difference between the second preferred embodiment and the first preferred embodiment is that the displaying frame 200 of the second preferred embodiment further includes a time-measuring unit 204 and a control unit 205. By controlling the control unit 205, the insulation part 202 of the displaying frame 200 can be movably extended or contracted. The time-measuring unit 204 is electrically connected to the control unit 205, and the time-measuring unit 204 is provided for setting a predetermined period of time which can be 10 minutes, half an hour, or an hour, but the invention is not limited to such arrangement only. The control unit 205 includes components such as a solenoid valve and a pneumatic cylinder, but the control unit 205 is not limited to the usage of the aforementioned components for executing its control operation only. Any appropriate controlled telescopic mechanism can be used for the extension or contraction and any control technology and components easily understood by those having ordinary skills in the art are covered by the scope of the present invention.

When the displaying frame 200 of the second preferred embodiment is provided for disposing the mobile electronic device 1 as shown in FIG. 1, the conductive part 201 presses against the electrical power contact 11 of the mobile electronic device 1 to provide electric power from the displaying frame 200 to the mobile electronic device 1, and a time-measuring unit 204 is used for measuring time elapsed after the connection. When the time elapsed after the connection measured by the time-measuring unit 204 reaches a predetermined period of time, the control unit 205 drives and controls the insulation part 202 to be stretched (wherein the original status of the insulation part 202 is partially or wholly hidden in the displaying frame 200) and inserted into the circuit-breaking contact 12 of the mobile electronic device 1, so as to push the control point 131 of the battery circuit 13 of the mobile electronic device 1 for breaking the battery circuit 13. Therefore, when the displaying frame 200 provides electric power to the mobile electronic device 1, the battery in the mobile electronic device 1 is charged. After the battery has been charged for the predetermined period of time, the battery circuit 13 is disconnected to avoid the battery in the mobile electronic device 1 being charged indefinitely, while assuring charging the battery sufficiently.

In summation of the aforementioned description of the displaying apparatus, the mobile electronic device, and the displaying frame in accordance with the present invention, the mobile electronic device includes an electrical power contact and a circuit-breaking contact, and the displaying frame includes a conductive part and an insulation part. When the mobile electronic device is disposed in the displaying frame, the conductive part is configured to press against the electrical power contact to transmit electric power to the mobile electronic device, and the insulation part is configured to be inserted into the circuit-breaking contact to push the control point for breaking the battery circuit. Now, the displaying frame can transmit electric power to the mobile electronic device through the conductive part and break the battery circuit of the mobile electronic device though the insulation part to prevent charging the battery in the mobile electronic device in order to protect the battery of the mobile electronic device from being damaged by a long time of charging.

Therefore, the displaying frame can provide electric power to the mobile electronic device with the battery circuit in the mobile electronic device disconnected to prevent the battery in the mobile electronic device from being charged indefinitely. Or the battery can be charged for a predetermined period of time after which the charging of the mobile electronic device is stopped. On the other hand, when the mobile electronic device is removed from the displaying frame, the battery circuit of the mobile electronic device resumes its electric connection and then is detached from the conductive part of the displaying frame which provides electric power. Therefore, the present invention can assure that the battery in the mobile electronic device will not be damaged by a long time of charging.

In addition, there may be a height difference between the conductive part and the insulation part of the displaying frame of the present invention, so that the conductive part presses against the electrical power contact to transmit electric power to the mobile electronic device, before the insulation pushed the control point for breaking the battery circuit to prevent a shutdown of the mobile electronic device by a sudden disconnection from the battery circuit. On the other hand, when it is necessary to remove the mobile electronic device from the displaying frame, the insulation part gets away from the control point to close the battery circuit, before the conductive part gets away from the electrical power contact. After the mobile electronic device is removed, the electronic device resumes its original normal functions for its users. Users no longer need to reboot the mobile electronic device due to the power disconnection occurred when the power supplies are switched.

While the invention has been described by means of specific embodiments, numerous modifications and variations could be made thereto by those skilled in the art without departing from the scope and spirit of the invention set forth in the claims.

What is claimed is:

1. A displaying apparatus, comprising:
    a mobile electronic device, including an electrical power contact, a circuit-breaking contact, and a battery circuit having a control point, wherein the electrical power contact is electrically connected to the battery circuit, and the circuit-breaking contact is positioned corresponding to the control point of the battery circuit; and
    a displaying frame, including a conductive part and an insulation part, wherein when the mobile electronic device is disposed in the displaying frame, the conductive part is configured to press against the electrical power contact to transmit electric power to the mobile electronic device, and the insulation part is configured to be inserted into the circuit-breaking contact to push the control point for breaking the battery circuit;
    wherein the conductive part of the displaying frame has a height greater than a height of the insulation part; when the mobile electronic device is disposed into the displaying frame, the conductive part presses against the electrical power contact to transmit electric power to the mobile electronic device, before the insulation part pushes the control point for breaking the battery circuit.

2. The displaying apparatus of claim 1, wherein the conductive part and the insulation part jut out from a surface of the displaying frame when the mobile electronic device is not disposed in the displaying frame.

3. The displaying apparatus of claim 2, wherein the conductive part of the displaying frame is elastic, and a height of the conductive part that juts out from the surface of the displaying frame is larger than a height of the insulation part that juts out from the surface of the displaying frame.

4. The displaying apparatus of claim 1, wherein when the mobile electronic device is removed from the displaying frame, the insulation part gets away from the control point to close the battery circuit, before the conductive part gets away from the electrical power contact.

5. The displaying apparatus of claim 1, wherein when the mobile electronic device is not disposed in the displaying frame, the conductive part juts out from a surface of the displaying frame and the insulation part is elastic and at least partially hidden inside of the displaying frame.

6. The displaying apparatus of claim 5, wherein the displaying frame further includes a time-measuring unit and a control unit electrically connected to the time-measuring unit, and when the mobile electronic device is disposed in the displaying frame, the time-measuring unit is configured to measure time for a predetermined period of time after which the control unit causes the insulation part to extend so as to push the control point for breaking the battery circuit.

7. The displaying apparatus of claim 1, wherein the displaying frame further includes a power supply to transmit the electric power to the mobile electronic device through the conductive part.

8. A mobile electronic device, including:
    an electrical power contact and a circuit-breaking contact; and
    a battery circuit, having a control point, wherein the electrical power contact is electrically connected to the battery circuit, and the circuit-breaking contact is positioned corresponding to the control point of the battery circuit, wherein when the mobile electronic device is disposed in a displaying frame including a conductive part and an insulation part, the electrical power contact is configured to press against the conductive part for transmitting electric power to the mobile electronic device, and the control point is to be pushed by the insulation part, inserted into the circuit-breaking contact, for breaking the battery circuit;
    wherein the conductive part of the displaying frame has a height greater than a height of the insulation part, such that the conductive part presses against the electrical power contact before the insulation part pushes the control point.

9. A displaying frame for use with a mobile electronic device including an electrical power contact, a circuit-breaking contact, and a battery circuit having a control point, the displaying frame including:
    a conductive part and an insulation part, wherein when the mobile electronic device is disposed in the displaying frame, the conductive part is configured to press against the electrical power contact to transmit electric power to the mobile electronic device, and the insulation part is configured to be inserted into the circuit-breaking contact to push the control point for breaking the battery circuit;
    wherein the conductive part of the displaying frame has a height greater than a height of the insulation part, such that the conductive part presses against the electrical power contact before the insulation part pushes the control point.

10. The displaying frame of claim 9, wherein the conductive part is elastic, and a height of the conductive part that juts out from a surface of the displaying frame is larger than a height of the insulation part that juts out from the surface of the displaying frame.

11. The displaying frame of claim 9, wherein the insulation part is elastic and at least partially hidden inside of the displaying frame.

12. The displaying frame of claim 11, further including a time-measuring unit and a control unit electrically connected to the time-measuring unit, and when the mobile electronic device is disposed in the displaying frame, the time-measuring unit is configured to measure time for a predetermined period of time after which the control unit causes the insulation part to extend so as to push the control point for breaking the battery circuit.

* * * * *